(12) United States Patent
Fotopoulou et al.

(10) Patent No.: US 9,716,121 B1
(45) Date of Patent: Jul. 25, 2017

(54) MAJORITY CURRENT ASSISTED RADIATION DETECTOR DEVICE

(71) Applicant: SOFTKINETIC SENSORS NV, Brussels (BE)

(72) Inventors: Kyriaki Korina Fotopoulou, Brussels (BE); Ward Van Der Tempel, Keerbergen (BE)

(73) Assignee: SOFTKINETIC SENSORS NV, Brussels (BE)

( * ) Notice: Subject to any disclaimer, the term of this patent is extended or adjusted under 35 U.S.C. 154(b) by 0 days.

(21) Appl. No.: 15/321,376

(22) PCT Filed: Jun. 24, 2015

(86) PCT No.: PCT/EP2015/064244
§ 371 (c)(1),
(2) Date: Dec. 22, 2016

(87) PCT Pub. No.: WO2015/197685
PCT Pub. Date: Dec. 30, 2015

(51) Int. Cl.
*H01L 27/146* (2006.01)
*G01S 7/486* (2006.01)
*H01L 31/11* (2006.01)

(52) U.S. Cl.
CPC ........ *H01L 27/1461* (2013.01); *G01S 7/4863* (2013.01); *H01L 27/1464* (2013.01); *H01L 31/11* (2013.01)

(58) Field of Classification Search
CPC .............. G01S 7/4863; H01L 27/1461; H01L 27/1464; H01L 31/11
See application file for complete search history.

(56) References Cited

U.S. PATENT DOCUMENTS 8,294,882 B2 * 10/2012 Van Der Tempel .. G01S 7/4913
356/5.01
2007/0164767 A1 7/2007 Herz
(Continued)

OTHER PUBLICATIONS

Gian-Franco Dalla Betta et al: "Design and Characterization of Current-Assisted Photonic Demodulators in 0.18-um CMOS Technology", IEEE Transactions on Electron Devices, IEEE Service Center, Piscataway, NJ, US, vol. 58, No. 6, Jun. 1, 2011 (Jun. 1, 2011), pp. 1702-1709, XP011323216, ISSN: 0018-9383, DOI: 10.1109/TED.2011.2126578.
(Continued)

*Primary Examiner* — Mark R Gaworecki
(74) *Attorney, Agent, or Firm* — Duane Morris LLP; J. Rodman Steele, Jr.; Gregory M. Lefkowitz

(57) ABSTRACT

The invention relates to a majority current assisted detector device, comprising a semiconductor layer of a first conductivity type epitaxially grown on a semiconductor substrate, at least two control regions of the first conductivity type, at least two detection regions of a second conductivity type opposite to the first conductivity type, and a source for generating a majority carrier current in the semiconductor layer between the two control regions, the majority current being associated with an electrical field. The detection regions surround the control regions, thereby forming at least two taps. The device is configured for backside illumination and further comprises a well of the first conductivity type between the two detection regions for insulating the detection regions. The well comprises pixel circuitry elements.

9 Claims, 6 Drawing Sheets

(56) References Cited

U.S. PATENT DOCUMENTS

2011/0255071 A1  10/2011  Van Der Tempel et al.
2015/0001664 A1   1/2015  Van Der Tempel et al.

OTHER PUBLICATIONS

Hossain Q D et al: "Current assisted photonic mixing demodulator implemented in 0.18um standard CMOS technology", Research in Microelectronics and Electronics, 2009. PRIME 2009. Ph.D, IEEE, Piscataway, NJ, USA, Jul. 12, 2009 (Jul. 12, 2009), pp. 212-215, XP031510429, ISBN: 978-1-4244-3733-7.

* cited by examiner

MAJORITY CURRENT ASSISTED RADIATION DETECTOR DEVICE

CROSS-REFERENCE TO RELATED APPLICATIONS

This application is a §371 national stage entry of International Application No. PCT/EP2015/064244, filed Jun. 24, 2015, which claims priority to European Patent Application No. 14174824.4 filed Jun. 27, 2014, the entire contents of which are incorporated herein by reference.

TECHNICAL FIELD OF THE INVENTION

The invention relates to a detector device assisted by majority current for detecting an electromagnetic radiation impinging on a semiconductor layer, wherein a majority carrier current is generated between two control regions and wherein photo-generated minority carriers are directed towards a detection region under the influence of an electrical field generated between the control regions.

The invention can be used in imagers, particularly Time-Of-Flight imagers, video games and other domestic appliances, etc.

BACKGROUND OF THE INVENTION

Computer vision is a growing research field that includes methods for acquiring, processing, analysing, and understanding images. Notably, one theme of research in computer vision is the depth perception or, in other words, the three-dimensional (3D) vision.

Time-Of-Flight technology, just to take this example, is one of the most promising technologies for depth perception. A Time-Of-Flight (TOF) camera system 3 is illustrated in FIG. 1. TOF camera systems capture 3D images of a scene 15 by analysing the time of flight of light from a light source 18 to an object. TOF camera system 3 includes a camera with a dedicated illumination unit 18 and data processing means 4.

The well-known basic operational principle of a TOF camera system is to actively illuminate the scene 15 with a modulated light 16 at a predetermined wavelength using the dedicated illumination unit, for instance with some light pulses of at least one predetermined frequency. The modulated light is reflected back from objects within the scene. A lens 2 collects the reflected light 17 and forms an image of the objects onto an imaging sensor 1 of the camera. Depending on the distance of objects from the camera, a delay is experienced between the emission of the modulated light, e.g. the so called light pulses, and the reception at the camera of those light pulses. Distance between reflecting objects and the camera may be determined as function of the time delay observed and the speed of light constant value. In one another more complex and reliable embodiment, a plurality of phase differences in between the emitted reference light pulses and the captured light pulses may be determined by correlation measurement and used for estimating depth information.

The determination of the phase differences can be carried out notably by Current-Assisted Photonic Demodulators (CAPDs). The principle of CAPDs is explained in EP1513202 B1 and illustrated by FIG. 2A-C. It is based on demodulation nodes, the so-called "taps". The CAPD represented on FIG. 2A-C comprises two taps. Each tap consists of a control region 61, 62 and a detection region 63, 64. By controlling a potential applied between the control regions 61 and 62, it is possible to control the detectivity of the associated tap. When a photon is incident within the photosentitive area of a pixel, an electron-hole e−/h+ pair may be generated at a certain position. The electron-hole pair will be separated by an electrical field that is present and that is associated with the flowing majority current. This electrical field will cause the photogenerated minority carriers 66, 69 to drift in the opposite direction to the flowing majority current, i.e. towards the detection regions 63, 64, respectively.

When a pixel comprises several taps and when a positive potential is applied to a tap with respect to the other taps, this tap is activated and will be receiving the majority of the photogenerated minority carriers in the pixel, as illustrated by FIGS. 2B and C. By applying appropriate driving signals to the control regions, correlation measurements can be performed and the depth perception can be obtained.

In FIG. 3, a 2-tap topology of CAPD is presented for illustrating prior art. The pixel contains two demodulation nodes or taps. Each tap consists of a control region 6, 8 and a detection region 5, 7, respectively. In this topology, each detection region 5, 7 is surrounded by a control region 6, 8, respectively. The pixel comprises also the circuitry 11, 12 associated with the taps. Circuitry elements 11, 12 and control region 6, 8 may be highly doped regions p+ whereas the detection region 5, 7 may be an n+ type region. Each detection region 5, 7 may be associated with a depletion region 13, 14, for instance n-well region. In prior art, the layer on which the device is formed is usually a p−− layer. The fact that p-type control region surrounds n-type detection region in a p-type layer enables to avoid leakages between the two detection regions.

The field created between two control nodes must be as high as possible in order to achieve a high detectivity and a high demodulation contrast. This requirement involves high power consumption; this is one of the main drawbacks of CAPDs. The power consumption P in a CAPD follows the following equation, R and ΔV being the resistance and the potential difference between the control regions, respectively:

$$P = R\left(\frac{\Delta V}{R}\right)^2 = \frac{\Delta V^2}{R}$$

The power consumption can be reduced by several ways. Firstly, the potential difference ΔV between the control regions can be decreased. Secondly, the distance between the control regions can be increased in order to increase the resistance between them. Both solutions would have an impact on the demodulation contrast of the device, as they impact the electric field intensity in the layer that determines the charge carrier transport velocity and the speed demodulation.

In a conventional CAPD implementation as shown in FIGS. 2 A-C and FIG. 3, reduction in power consumption is typically achieved by separating the nodes by high-ohmic epitaxial layer (for example doped p−−) which, as a consequence, consumes valuable pixel optical area and renders the shrinking of the pixel pitch challenging. In addition, the pixel transistors are located typically in a p-well area, again physically separate from the detection nodes of the pixel. The separation requirement means space that cannot be used for other things such as pixel transistors. Therefore, in conventional CAPDs reducing the pixel pitch remains very challenging when coupled with a device specification targeting low power consumption and high fill factor.

A solution remains to be proposed in order to decrease the power consumption of CAPDs while reducing the size of the pixels and maintaining a high speed of demodulation. This current invention proposes a CAPD device architecture that provides a solution for further pixel miniaturisation without the detrimental power consumption impact of a conventional CAPD approach in small pixel pitches and at the same time it allows a platform for implementing the CAPD configuration in a BSI implementation.

SUMMARY OF THE INVENTION

The present invention relates to a detector device assisted by majority current according to claim 1.

Advantageously, the semiconductor layer is lightly doped with a dopant of the first conductivity type ($p^-$ or $n^-$). The concentration of dopant is preferably adapted for providing a good electrical insulation between the detection regions.

The layer may also be formed on a substrate, the dopant concentration of the substrate being higher than the dopant concentration of the semiconductor layer.

The illumination may be a Front Side Illumination (FSI), or, preferably, a Back-Side-Illumination (BSI).

Preferably, the detector device may comprise a semiconductor region of the first conductivity type formed in the semiconductor layer and located between the two detection regions, for insulating the detection regions, wherein the semiconductor region (45) is at least one of an ohmic contact, a well or a deep well. This semiconductor region provides a strong insulation of the control regions.

In the case of a BSI implementation, the semiconductor region located between the two detection regions, being a well or a deep well, can be arranged for receiving pixel circuitry elements. This is really advantageous, because the size of the device can be considerably reduced, while ensuring the insulation of the detection regions.

Other advantages and novel features of the invention will become more apparent from the following detailed description when taken in conjunction with the accompanying drawings.

BRIEF DESCRIPTION OF THE DRAWINGS

The present invention shall be better understood in light of the following description and the accompanying drawings.

Advantages and novel features of the invention will become more apparent from the following detailed description when taken in conjunction with the accompanying drawing.

DESCRIPTION OF THE INVENTION

The invention will be explained with reference to p-type epitaxial layer and substrate, but the present invention includes within its scope a complementary device whereby p and n regions become n and p regions respectively. A skilled person can make such modification without departing from the spirit of the invention.

It should also be understood that the terms n, p, $n^+$, $p^+$, $p^-$ and $p^{--}$, n-well, p-well, deep n-well and deep p-well are well known by the one skilled in the art. The terms n, p, $n^+$, $p^+$, $p^-$ and $p^{--}$ refer to ranges of doping levels in semiconductor materials well known by the one skilled in the art.

The terms n and p refer to n-doped and p-doped regions, usually arsenic and boron doped regions, respectively. $n^+$, $p^+$ refer to highly doped shallow contact regions for NWELL and PWELL respectively. $p^-$ refers to lowly doped p type region such as a PWELL and $p^{--}$ refers to very lowly doped p type region close to intrinsic concentration at least 2 orders of magnitude lower than $p^-$. In this case, $p^{--}$ can be an epitaxial highly resistive or high ohmic layer with a resistivity of about 550-10 kOhm·cm. For example, based to this values for $p^{--}$, $p^-$ concentration can correspond to a resistivity of about 15 Ohm·cm-100 Ohm·cm and a $p^{++}$ can correspond to a resistivity of about 0.01-1 Ohm·cm.

Standard semiconductor materials used for CMOS baseline applications, such as logic, are epitaxial layers with a resistivity of 15 Ohm·cm and substrates with a resistivity of 0.001 Ohm·cm.

For RF and power high voltage applications, the resistivity of epitaxial layer is about 50 Ohm·cm to 120 Ohm·cm with a thickness of 4 µm.

For imagers, such as the CAPD, epitaxial layer are commonly used, with a thickness of 10 to 23 µm and with a resistivity of 500 Ohm·cm to 10 k Ohm·cm, and with substrate otherwise known as bulk with a resistivity of 0.01 Ohmc·cm to 1 Ohm·cm.

The present invention relates to embodiments regarding both Front Side Illumination (FSI) and Back Side Illumination (BSI) devices. Front Side Illumination and Back Side Illumination devices are defined by referring to the location of the circuitry on the chip compared to the impinging light. By FSI, it is meant a device where the light impinges on the same side than the circuitry. With FSI, light falls on the front side of the circuitry, and passes through the readout circuitry and interconnects before it is collected in the photodetector.

On the contrary, by BSI, it is meant a device where the light impinges on the other side, where the circuitry is not located. The main idea behind the fact of using BSI structure is that no light is lost while passing through the circuitry.

Figure 1:
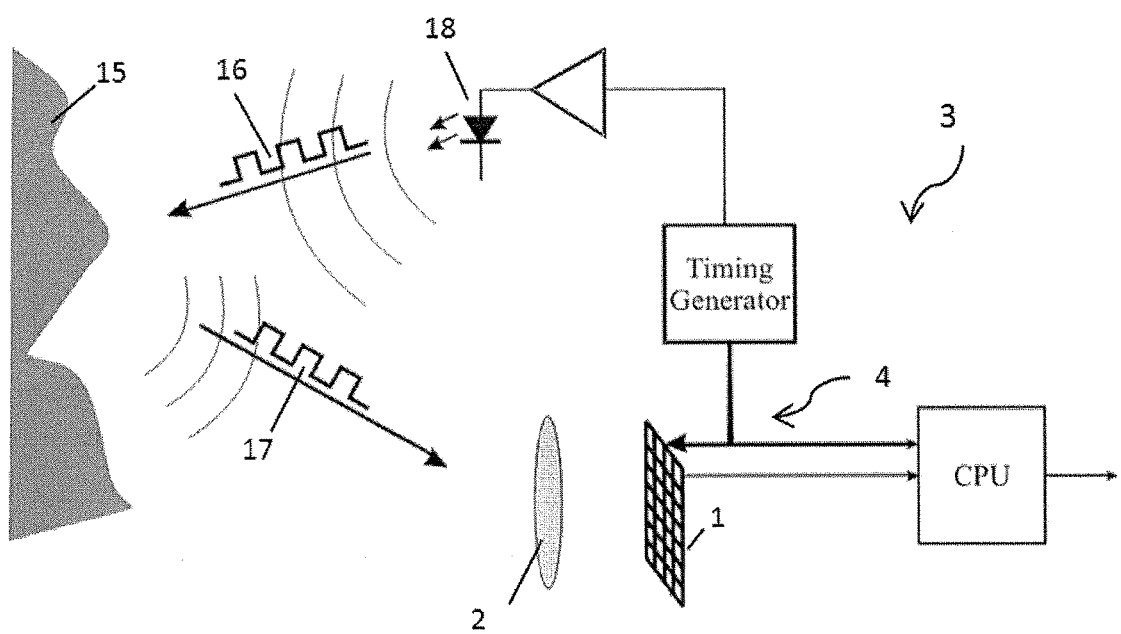
FIG. 1 illustrates the basic operational principle of a TOF system.
Figure 2:
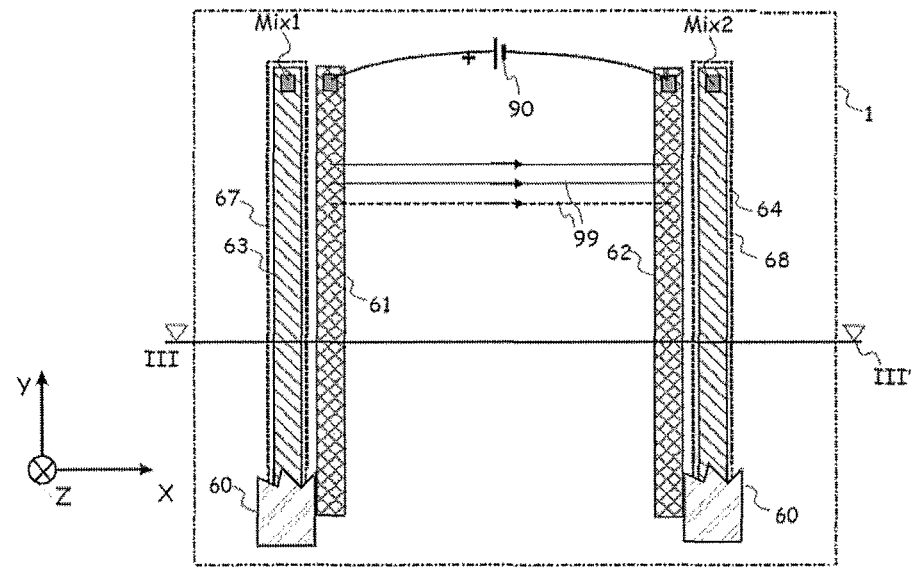
FIG. 2A shows a top view of a device according to prior art.
FIG. 2B and FIG. 2C show a cross-section of the device of FIG. 2A with two different current conditions.
Figure 2:
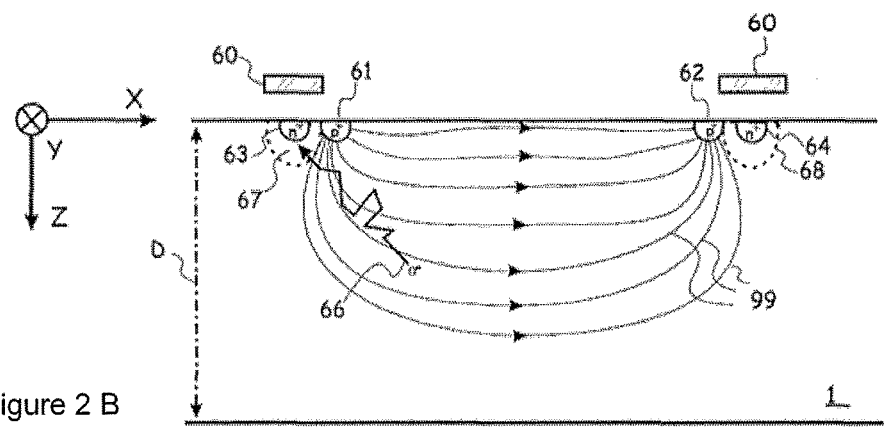
Figure 2:
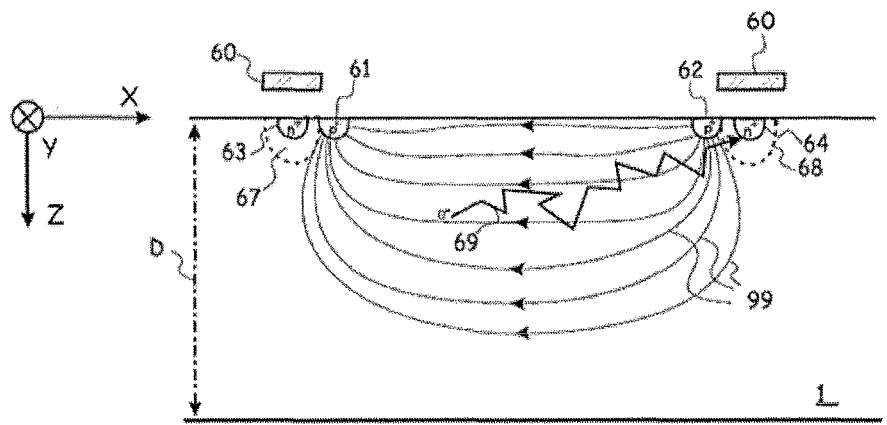
Figure 3:
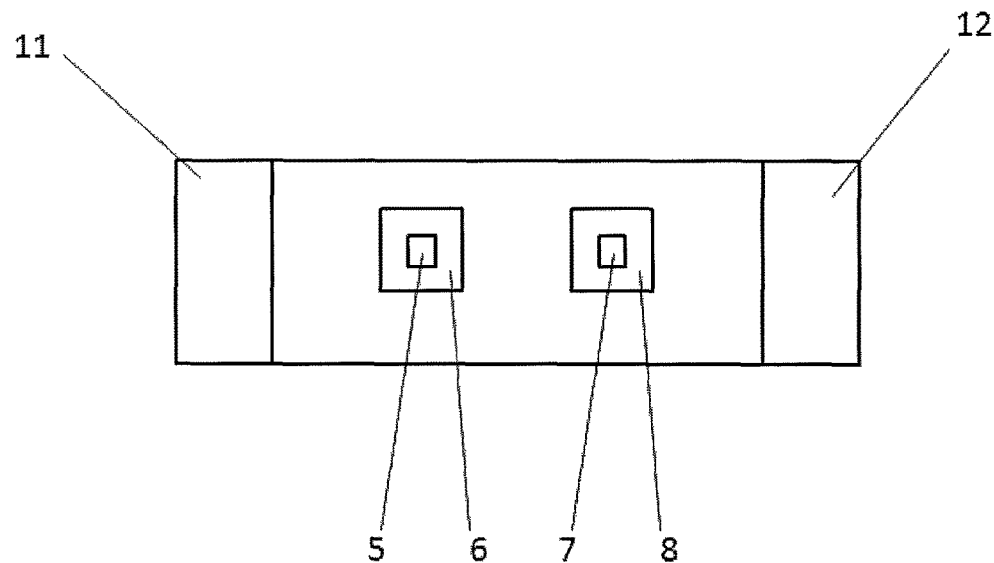
FIG. 3 shows a top view of a pixel according to prior art, wherein the control regions surround the detection regions.

FIG. 3 shows a top view of a first embodiment of a detector device according to the present invention. In FIG. 3, the detector device comprises four taps, formed in a semiconductor layer 40. Each tap comprises a control region MIX0, MIX1 surrounded by a detection region DET0, DET1, respectively. The detection regions may be rectangular shaped as represented in FIG. 3, but not only. A source 41 injects current in control region MIX0 and drains current in control region MIX1. This source generates a majority carrier current in the semiconductor layer 40 between the control regions MIX0, MIX1, the majority current being associated with an electrical field. In the configuration presented in FIG. 3, the majority carriers are holes $h^+$ and the minority carriers are electrons $e^-$. Line A-A' in FIG. 4 shows where the cross-sections are made for FIG. 5.

Figure 4:
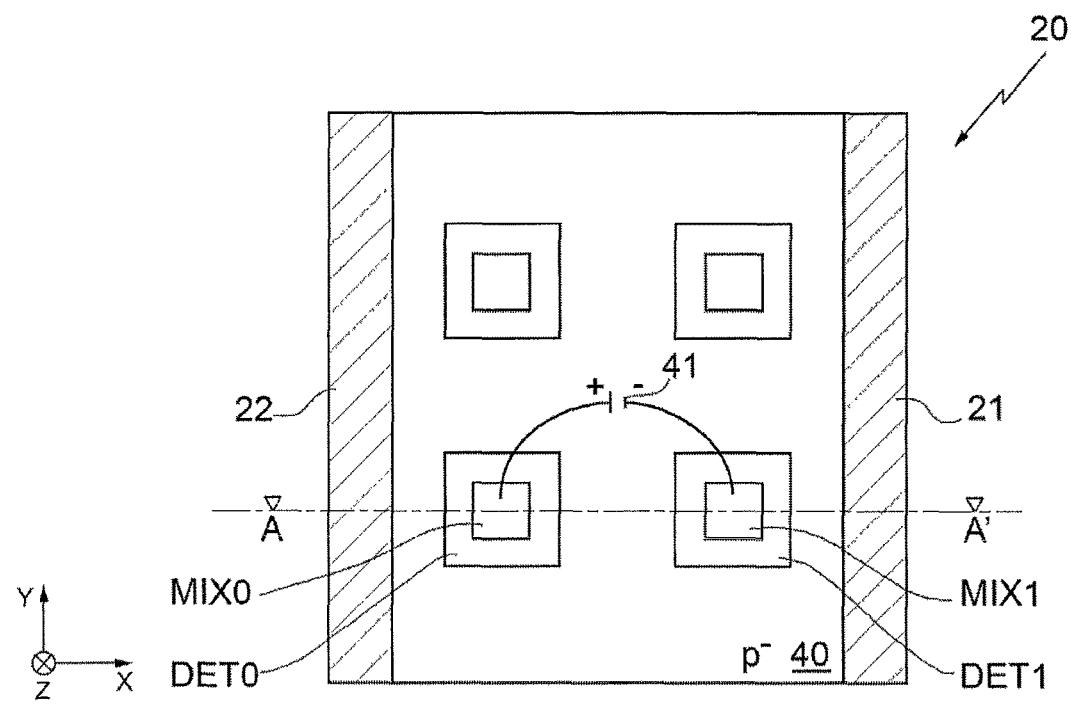
FIG. 4 shows a top view of a first embodiment of a detector device according to the present invention.

In FIG. 4, the detector device is depicted as a square. It is important to mention that the control mix electrode is an island encapsulated by the detector electrode ring so that another potential geometry can advantageously be implemented such as a circle or a polygone but this is not limited thereto.

Figure 5:
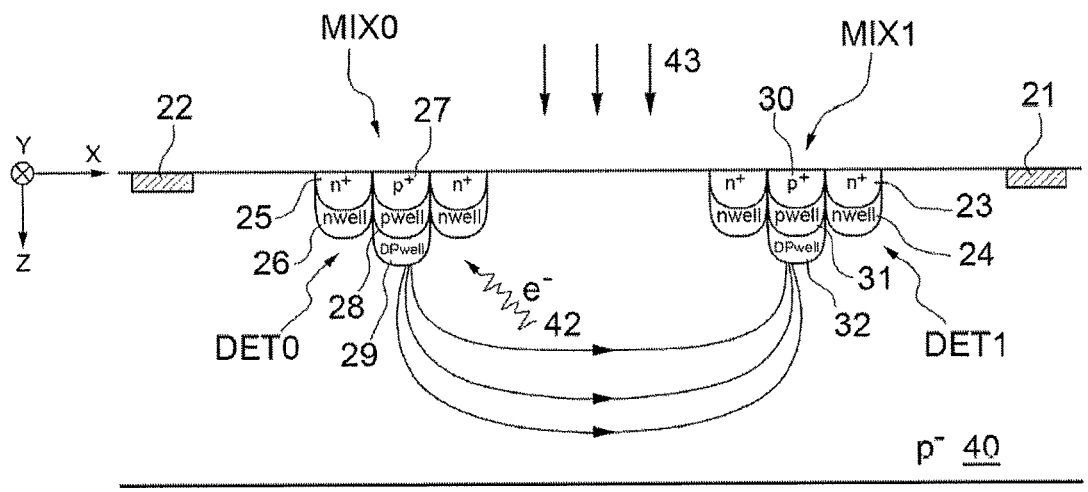
FIG. 5 shows a cross-section of the detector device of FIG. 4 along the line A-A'.

In FIG. 5, the majority hole current is shown by solid lines and its direction is represented by arrows. When an electromagnetic radiation 43, e.g. photons, impinges the layer 40, some electron-hole pairs are generated in the layer 40. The electron-hole pairs are separated by the electrical field that is present and which is associated with the flowing majority hole current. The minority carriers 42 move towards the detection region which is closer to the region where the majority carriers are drained, i.e. DET0 here. DET1 could also be activated according to the potentials applied on MIX0 and MIX1. Movements of electrons are due to drift based on the present electrical field associated with the flowing majority current.

The control regions MIX0, MIX1 comprise at least a PWELL 28, 31. They may comprise three distinct regions, a p+, a PWELL and a deep PWELL. A highly doped semiconductor contact 27, 30, e.g. a $p^+$ contact, may be formed above the PWELL 28, 31. The fact of highly doping this contact creates an ohmic contact used for injecting the majority current via the source 41. A deep PWELL 29, 32 may also be provided below the PWELL. The purpose of the deep PWELL is to extend the controlling electrode deeper into the layer 40 so that it provides a good control of the epitaxial layer potential and enhances the lateral field between the two MIX contacts.

The detection regions DET0, DET1 may comprise at least a NWELL 24, 26 forming a p-n junction with the semiconductor layer 40 for collecting generated minority carriers 42. The detection regions DET0, DET1 may comprise, but are not limited to, an n-type region that can be any combination of the following: N+ implant, NWELL or deep NWELL creating a pn junction photodetector such as N+/PSUB, NWELL/PSUB, DNWELL/PSUB photodiode with the semiconductor layer 40 for collecting generated minority carriers 42. The detection regions DET0, DET1 may also comprise a $n^+$ contact 23, 25 formed above the NWELL 24, 26 for creating an ohmic contact with the circuitry 21, 22 and enabling for instance the reading of the minority carriers via a read-out circuitry. The NWELL 24, 26 should be located close to the hole current source MIX0, MIX1 in order to increase the chance and the speed with which the electrons will diffuse into the NWELL 24, 26 through the detecting pn-junction and thus to increase the sensitivity of the detector. The NWELL should be able to capture the photo generated electrons captured by the lateral field between the two MIX electrodes and drifted towards the tap with the higher bias.

In prior art, as illustrated by FIG. 3, the p-type control regions 6, 8 surround the n-type detection region 5, 7 and are formed in a p-type layer. This means that the detection regions 5, 7 are electrically insulated by the surrounding control regions 6, 8 and the captured minority carriers cannot leak. Short-circuits cannot be formed between the detection regions. In the FSI (Front Side Illumination), the wafer material used for the CAPD implementation is usually an epitaxial layer doped $p^{--}$, where the photodiodes and pixel circuitry is build. This $p^{--}$ layer is lightly doped by boron to obtain a resistivity between 500 Ohm·cm and 10 k Ohm·cm. A substrate can also be used. It usually an highly boron doped material $p^{++}$ with a resistivity of 0.01-1 Ohm·cm, on which the epitaxial silicon layer is built. Usually, for Infra Red (IR) application (850 nm), the substrate or wafer has an overall thickness of 750 μm out of which the top 23 μm is the high resistive or lowly doped epitaxial silicon layer where the photogenerated minority carriers (e–) are created.

The thickness of the epitaxy layer is tuned to comply with the absorption of IR light in silicon which is in the order of 15-20 μm. The minority carriers should be generated in the epitaxial layer and not in the substrate so that they can be collected by the detectors or the cathodes of the photodiode junctions. The recombination inside the highly doped substrate has to be avoided.

In the present invention, the location of p-type control regions MIX0, MIX1 and n-type detection regions DET0, DET1 is changed and the detection regions DET0, DET1 surround the control regions MIX0, MIX1. In the present invention, the control regions MIX0, MIX1 are islands encapsulated by the detection regions. This change enables the distance between the nodes to reduce without compromising on the power consumption by using the NWELL detector regions as isolation between the two MIX electrodes. Hence, the resistance between the two MIX contacts remains high and the pixel size is reduced. By interchanging the position of control and detection regions, the n-type detection regions DET0, DET1 are now closer, which increase the chance of short-circuits and leakage of captured minority carriers. The present invention proposes to adapt the conductivity of the semiconductor layer 40 in order to provide an electrical insulation between the detection regions DET0, DET1 for avoiding leakage of minority carriers. A resistivity of at least 50 Ohm·cm allows sufficient isolation between the detection NWELL without significant impact on the power consumption as the PWELL MIX regions are encapsulated by the NWELL rings. The conductivity of the semiconductor layer 40 can be adapted for example by lightly doping the layer 40. The layer 40 may for example be doped $p^-$ instead of $p^{--}$ in the prior art. The fact of doping slightly more the layer 40 enables to increase slightly the concentration of holes in the layer and, thus, to decrease slightly the concentration of electrons in the layer 40. With a less resistive layer, the electron captured in the detection regions DET0, DET1 cannot leak anymore. The region around and between the detection regions DET0, DET1 should provide such an insulation.

The layer 40 may also comprise a semiconductor region, formed in the semiconductor layer and located between the detection regions. The layer 40 can contain a p-type implanted semiconductor region 45 that can be a shallow p+ layer, PWELL or deep PWELL between the detection elements DET0, DET1 to electrically isolate the two taps. A layer of shallow p+ or deeper PWELL can also be implemented between the NWELL nodes to isolate the two taps. This embodiment is not represented for the FSI case, but only BSI case, in FIG. 6, but it should be understood that this embodiment can be implemented in both FSI and BSI cases.

Figure 6:
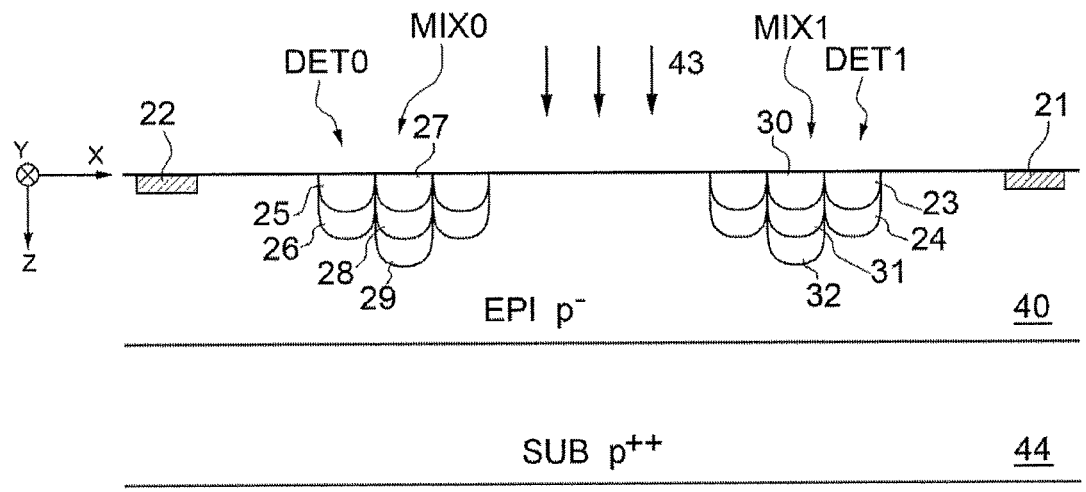
FIG. 6 shows a cross-section of a detector device according to another embodiment of the invention.

In a further embodiment presented in FIG. 6, the layer 40 may be formed on a substrate 44. The concentration of dopants in the substrate 44 may be higher than the one of the layer 40. For instance the substrate 44 may be a $p^{++}$ layer whereas the layer 40 may be a $p^-$ layer. This means that if the initial substrate 44 on which the device is built is $p^{++}$, then a layer 40 lightly doped $p^-$ should be formed above, prior building the control and detection regions MIX0, MIX1, DET0 and DET1. The conductivity of layer 40 between the detection regions DET0, DET1 should be adapted for providing electrical insulation and avoiding a leakage of minority carriers.

In the embodiments illustrated by FIGS. 5 and 6, the illumination 43 is a Front-Side-Illumination (FSI), i.e. the light impinges on the layer 40 on the same side as the circuitry 22, 21.

Figure 7:
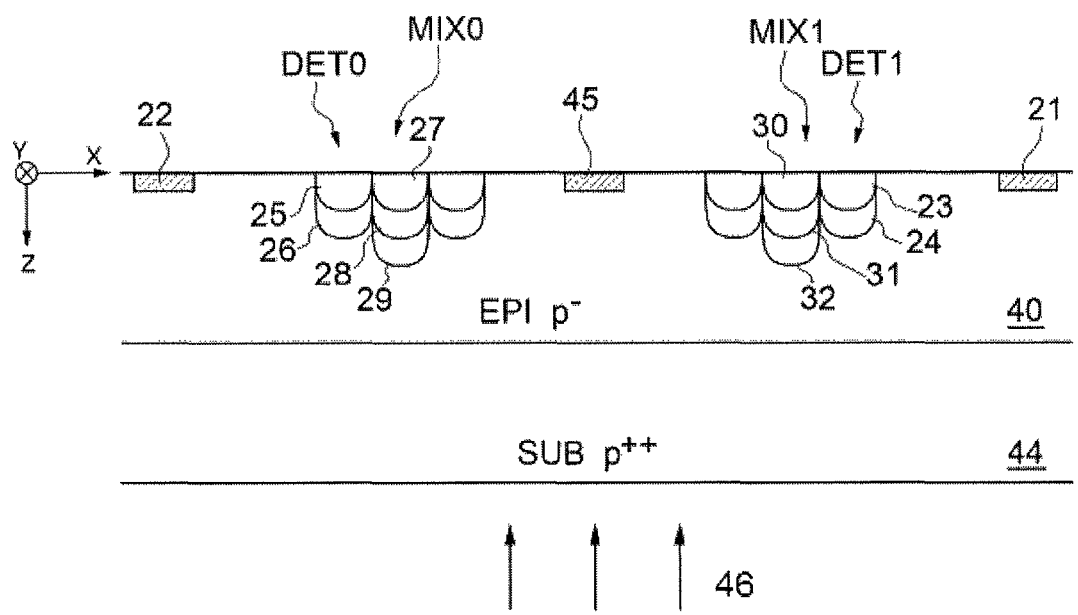
FIG. 7 shows a cross-section of a detector device according to a further embodiment of the invention, wherein the illumination is a Back-Side-Illumination.

In a further embodiment presented in FIG. 7, the illumination 46 is a Back-Side-Illumination (BSI) and impinges on the substrate 44 on the other side of the chip. In the BSI case, the epitaxial layer 40 is thinned down to a range of, for example, 5-100 um (preferably 5 to 30 um) depending on the illumination wavelength of the targeted application. The highly doped substrate layer 44, is replaced by a thin layer in the order of 1-3 um depending on the process flow selected. The doping of this shallow implanted layer 44 is of the same order of magnitude as the original SUB p++ layer 44 in the FSI case.

In the BSI case, the same wafer material is used so the same nomenclature for lowly doped $p^{--}$, epitaxial silicon and highly doped $p^{++}$ substrate can be applied.

The difference between the BSI and the FSI is that, in the BSI case, the majority of the highly doped $p^{++}$ substrate is consumed by a back grinding step of the BSI processing. The backside of the wafer becomes the front side i.e. the optical area where the light is impinging. The majority of the substrate is back grinded to expose the lowly doped or highly resistivity epitaxy.

This change from FSI to BSI enables to place circuitry elements inside region 45 in between the taps for reducing the total size of the pixel 20, without affecting the fill factor of the device. The function of region 45 is to provide electrical isolation between the detectors and may contain circuitry. A shallow p+, PWELL or deep PWELL implant can be applied in region 45 located between the DET0, DET1 areas to isolate the two taps. Region 45 can be an electrically floating island or grounded in the embodiment of the invention where pixel circuitry is buried within. In case a PWELL or deep PWELL implants are applied, region 45 can accommodate circuitry elements (PIXEL circuitry in FIG. 8) and can be referred to as the circuit element region of the pixel.

In such a case, the resistivity of the $p^-$ 40 layer can be a standard CMOS baseline doping; for instance 15 ohm·cm. A $p^{--}$ epitaxy layer of 550 Ohm·cm to 10 k Ohm·cm can also be used in conjunction with region 45 to isolate the two taps. The fact of implementing a Back-Side-Illumination enables also a more efficient light collection. The resulting images have less digital noise, and low-light performance can be improved.

In FIG. 6, the detector device is presented with a layer 40 and a substrate 44. The device could also be implemented with only one layer 40, as in FIG. 5, if the conductivity of the layer 40 is adapted for providing electrical insulation between the detection regions DET0 and DET1.

Figure 8:
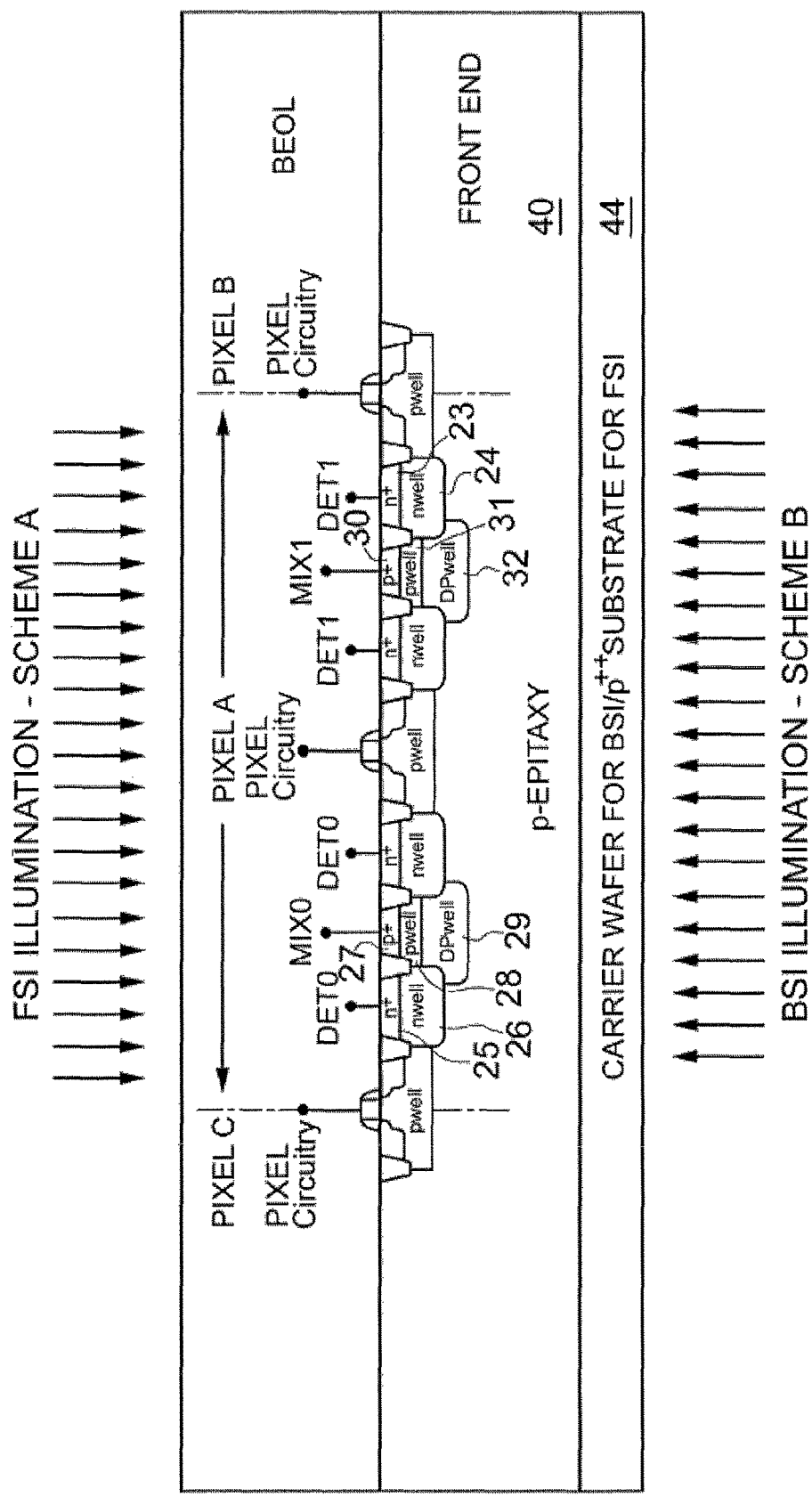
FIG. 8 illustrates the differences between the FSI and BSI embodiments of the invention.

In FIG. 8, the differences between the devices for Front-Side-Illumination (Scheme A) and Back-Side-Illumination (Scheme B) are better represented. In the BSI case, the epitaxial layer is thinned down to a depth depending on the illumination wavelength of the targeted application, for example, 5-100 μm and preferably 5 to 30 μm for Infra-red illumination wavelength. The highly doped substrate layer 44 of FIG. 6 and FIG. 7 is replaced by a thin layer in the order of 1-3 μm depending on the process flow selected. The doping of this shallow implanted layer 44 is of the same order of magnitude as the original SUB p++ layer 44 in the FSI case of FIG. 7. It should be understood that, in the FSI case, semiconductor regions 45 are not arranged for receiving pixel circuitry elements.

The invention claimed is:

1. A current-assisted photonic demodulator for detecting an electromagnetic radiation comprising:
   a semiconductor layer on which an impinging electromagnetic radiation can generate pairs of majority and minority carriers therein and which is doped with a dopant of a first conductivity type,
   at least two control regions (MIX0, MIX1) formed in the semiconductor layer, being doped with a dopant of the first conductivity type;
   a source, electrically connected to the two control regions, for generating a majority carrier current in the semiconductor layer between the two control regions (MIX0, MIX1), the majority carrier current being associated with an electrical field;
   at least two detection regions (DET0, DET1) formed in the semiconductor layer and being doped with a dopant of a second conductivity type opposite to the first conductivity type, for forming a junction and collecting generated minority carriers, the minority carriers being directed towards one of the two detection regions (DET0, DET1) under the influence of the electrical field associated with the majority carrier current;
   the two detection regions (DET0, DET1) surround the two control regions (MIX0, respectively, MIX1) in a plane parallel to the semiconductor layer, for forming at least two taps, consisting, each, of a control region and a detection region;
   the concentration of dopants of the first conductivity type in the semiconductor layer provides an electrical insulation between the detection regions (DET0, DET1) by avoiding leakage of minority carriers from the detection regions (DET0, DET1);
the detector device, wherein:
   the thickness of a semiconductor substrate on which the semiconductor layer is formed is configured for Back Side Illumination;
   the semiconductor layer is an epitaxial layer;
   the detector device further comprises a semiconductor region of the first conductivity type formed in the semiconductor layer (40) and located between the two detection regions (DET0, DET1) for insulating the detection regions (DET0, DET1), the semiconductor region being a well or a deep well and comprising pixel circuitry elements.

2. The detector device of claim 1, wherein the semiconductor layer is an epitaxial layer $p^-$ doped.

3. The detector device of claim 1, wherein the semiconductor layer is an epitaxial layer $n^-$ doped.

4. The detector device according to claim 1, wherein the semiconductor layer is formed on a semiconductor substrate doped with a dopant of the first conductivity type, wherein the dopant concentration of the semiconductor substrate is higher than the dopant concentration of the semiconductor layer.

5. The detector device according to claim 1, wherein the detection regions (DET0, DET1), comprises a well doped with a dopant of a conductivity type opposite to the first conductivity type.

6. The detector of claim 5, wherein the detection regions (DET0, DET1) further comprise an ohmic contact formed in the semiconductor layer on top of said well of said opposite conductivity type.

7. The detector device according to claim 1, wherein the control regions (MIX0, MIX1) comprise a well doped with a dopant of first conductivity type.

8. The detector device according to claim 7, wherein the control regions (MIX0, MIX1) further comprise an ohmic contact formed in the semiconductor layer on top of said well of said first conductivity type.

9. The detector device according to claim 7, further comprising a deep well, doped with a dopant of first conductivity type, formed in the semiconductor layer below the well of the control regions (MIX0, MIX1) for providing a strong field between the control regions (MIX0, MIX1).

* * * * *